(12) United States Patent
Tanaka et al.

(10) Patent No.: US 8,017,980 B2
(45) Date of Patent: Sep. 13, 2011

(54) LIQUID CRYSTAL DISPLAY APPARATUS

(75) Inventors: Toshiaki Tanaka, Kodaira (JP); Hiroki Kaneko, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 512 days.

(21) Appl. No.: 11/941,108

(22) Filed: Nov. 16, 2007

(65) Prior Publication Data

US 2008/0117649 A1  May 22, 2008

(30) Foreign Application Priority Data

Nov. 17, 2006  (JP) .................................. 2006-310941

(51) Int. Cl.
*H01L 29/80* (2006.01)

(52) U.S. Cl. ............. 257/257; 257/81; 257/84; 257/99; 257/228; 257/461

(58) Field of Classification Search .................. 257/80, 257/81, 83, 84, 99, 100, 184, 228, 257, 290, 257/461, 676, E51.022, E25.032
See application file for complete search history.

(56) References Cited

U.S. PATENT DOCUMENTS

| 5,298,768 | A  | * | 3/1994 | Okazaki et al. | 257/81 |
| 2006/0091406 | A1 | * | 5/2006 | Kaneko et al. | 257/81 |
| 2006/0092618 | A1 | * | 5/2006 | Tanaka et al. | 362/19 |
| 2007/0085944 | A1 | * | 4/2007 | Tanaka et al. | 349/69 |

FOREIGN PATENT DOCUMENTS

| JP | 2006-196543 | 7/2006 |
| JP | 2006-210730 | 8/2006 |
| JP | 2006-210961 | 8/2006 |

OTHER PUBLICATIONS

Suehiro Yoshinobu et al; Detailed Description of Translation of JP-2006-210730 cited on IDS filed Nov. 16, 2007; pp. 120.*
Suehiro Yoshinobu et al; Drawings of Translation of JP-2006-210730 cited on IDS filed Nov. 16, 2007; pp. 1-9.*

* cited by examiner

*Primary Examiner* — N Drew Richards
*Assistant Examiner* — Joannie A Garcia
(74) *Attorney, Agent, or Firm* — Antonelli, Terry, Stout & Kraus, LLP.

(57) ABSTRACT

An illumination apparatus includes a plurality of light emitting diode devices mounted therein and the light emitting diode device includes a substrate, a light emission area having a light emitting layer and a clad layer formed by growing crystal on the substrate, a negative polarity and a positive polarity. The light emission area has 6 or more opposite corners, which are disposed symmetrically to the middle of the light emitting diode device.

16 Claims, 15 Drawing Sheets

A

B

LIQUID CRYSTAL DISPLAY APPARATUS

BACKGROUND OF THE INVENTION

The present invention relates to a light source using light emitting diode (LED) devices and a liquid crystal display apparatus using the light source as backlight.

Light emitting diode (LED) devices are being applied to liquid crystal display apparatuses gradually but the light emission efficiency thereof does not yet reach the level at which the requirement therefor is satisfied sufficiently. In order to improve the light emission efficiency, high refractive index material is used as resin material in peripheral part and the reflection factor of material for a reflecting plate of a package is improved. However, the external quantum efficiency of the LED device is usually as small as 20 to 30% and further improvement is required. The structure of improving the light taking-out efficiency of the LED device itself is important since the light emission efficiency can be improved directly.

Publicly known techniques of improving the light taking-out efficiency of the LED device constituting light sources of illumination apparatuses and backlight modules of the liquid crystal display apparatuses are described below.

In prior art technique, JP-A-2006-210730 discloses a light taking-out groove formed in LED device. This publication describes the groove formed to prescribe the range of an inclination angle to take out light effectively, so that light is emitted from divided light emission areas to the outside efficiently.

Moreover, JP-A-2006-196543 and JP-A-2006-210961 describe uneven structure formed in a substrate in which crystal grows or in light transmissible electrode provided on the surface of crystal. Transmission light is obtained efficiently as diffuse light in the uneven structure formed in an interface of the substrate or the surface electrode without limited to the total reflection angle of the interface.

SUMMARY OF THE INVENTION

The above publicly known examples describe the division groove provided in the light emission area and the uneven structure provided in the interface of the substrate and the surface electrode in order to realize the light taking-out structure of the device, although the shape of the light emission area and the effective light taking-out direction are not described concretely. Further, a method of electrically dividing the light emission area of the device to control the divided areas is not described at all.

In the present invention, the liquid crystal display apparatus including an LED backlight module having LED devices mounted therein as a light source and a liquid crystal panel is described and the structure of the light emission area having the improved light emission efficiency of the device and control of the light emission distribution are also described. The light illumination area expanded by devising package structure and sealing resin shape is further described. In the description, the light sources for illumination and backlight are operated with high efficiency to realize the liquid crystal display apparatus having low power consumption. Moreover, the liquid crystal display apparatus having the brightness distributed high uniformly in the illumination area is realized.

In order to solve the above problems, according to the present invention, in an illumination apparatus including a plurality of light emitting diode devices mounted therein, the light emitting diode device includes a substrate, a light emission area having a light emitting layer and a clad layer formed by growing crystal on the substrate, a anode electrode and a cathode electrode. The light emission area has 6 or more opposite corners and the illumination apparatus is constructed so that the opposite corners are disposed symmetrically to the middle of the light emitting diode device.

Moreover, the illumination apparatus is constructed so that the plurality of light emitting diode devices are mounted on a wired substrate and the substrate is mounted so that opposite corners of the substrate in the light emitting diode device are positioned in the direction of wiring. Further, the illumination apparatus is constructed so that the plurality of light emitting diode devices are mounted on the wired substrate and mounted in arrangement of triangular lattice or zigzag in the wired substrate. Furthermore, the liquid crystal display apparatus is constructed using the illumination apparatus as a backlight source. The light emitting diode device is mounted on wiring having a reflecting plate and a shape of an inner periphery of the reflecting plate is formed into cone or peanut symmetrical to directions of both the right and left sides. The light emitting layer is disposed in the middle of an inner peripheral area of the reflecting plate and sealed by transparent resin. Moreover, the light emitting diode device is mounted on wiring without provision of the reflecting plate. The transparent resin sealing the light emitting layer is formed into cone or peanut symmetrical to the directions of both the right and left sides and the light emitting layer is disposed in the middle of the inner peripheral area of the transparent resin.

Further, according to another aspect of the present invention, in the illumination apparatus including a plurality of light emitting diode devices mounted therein, the light emitting diode device includes a substrate, a light emission area having a light emitting layer and a clad layer formed by growing crystal on the substrate, a anode electrode and a cathode electrode. The light emission area and the substrate each have four opposite corners. The illumination apparatus is constructed so that the directions of the opposite corners of the light emission area and those of the substrate are shifted or deviated from each other by 30 to 60 degrees.

According to the present invention, there can be realized the illumination apparatus including light emitting diode (LED) devices having the light emission efficiency capable of being improved by introducing original light taking-out structure and having the uniformity of brightness enhanced by mounting the devices in the package and the display apparatus using the illumination apparatus as a backlight.

According to the present invention, the light emission efficiency is improved by the light taking-out structure of the LED devices constituting the light source of the illumination apparatus and the liquid crystal display apparatus and the light emission distribution is controlled by the package structure.

Other objects, features and advantages of the invention will become apparent from the following description of the embodiments of the invention taken in conjunction with the accompanying drawings.

DESCRIPTION OF THE EMBODIMENTS

Embodiments for carrying out the present invention are now described.

Embodiment 1

Referring now to FIGS. 1 to 10, an embodiment of the present invention is described.

Figure 1:
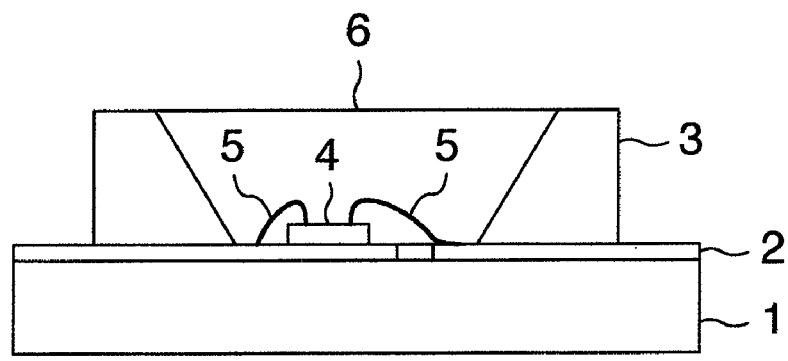
FIG. 1 is a sectional diagram illustrating package structure in which a light emitting diode device of a surface mounting type is mounted.

Representative sealing structure of a light emitting device contains package structure of a surface mounting type. FIG. 1 is a sectional view illustrating the package structure in which light emitting diode (LED) device of the present invention is mounted. The LED device mounted in the package structure of FIG. 1 may be mounted by means of wire bonding or flip chips, although in the embodiment the case where the LED device is mounted by means of wire bonding is described. Wiring 2 on which LED device is mounted is disposed on a metal or ceramic substrate 1 having an insulating layer and a reflecting plate 3 in which mounting position is defined is mounted on the wiring 2. Then, the light emitting diode device 4 is wire-bonded by means of die bonding and Au wires 5 to be mounted. Sealing is then made thereto by means of transparent resin 6 to form package structure.

Elements sealed usually in the package structure are now described.

Figure 2:
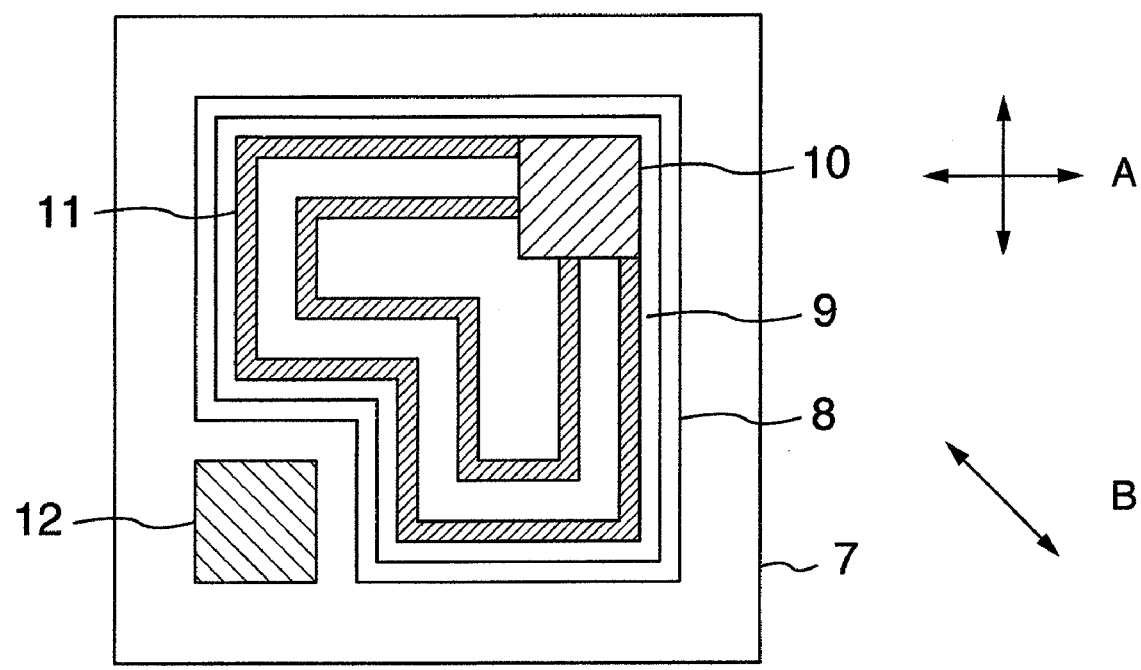
FIG. 2 is a top view illustrating electrode structure of a conventional light emitting diode device.

FIG. 2 is a top view illustrating an LED device in a prior art. A light emission area 8 mounted on a monocrystal substrate 7 and containing a light emitting layer and a clad layer and a transparent electrode layer 9 are fabricated by means of wet etching or dry etching and then a cathode electrode 10, a positive narrow electrode 11 and a anode electrode 12 are formed by means of evaporation. The polarities of the electrodes are defined to be fitted to those of semiconductor layers and the positive polarities and the negative polarities may be reversed.

Figure 3:
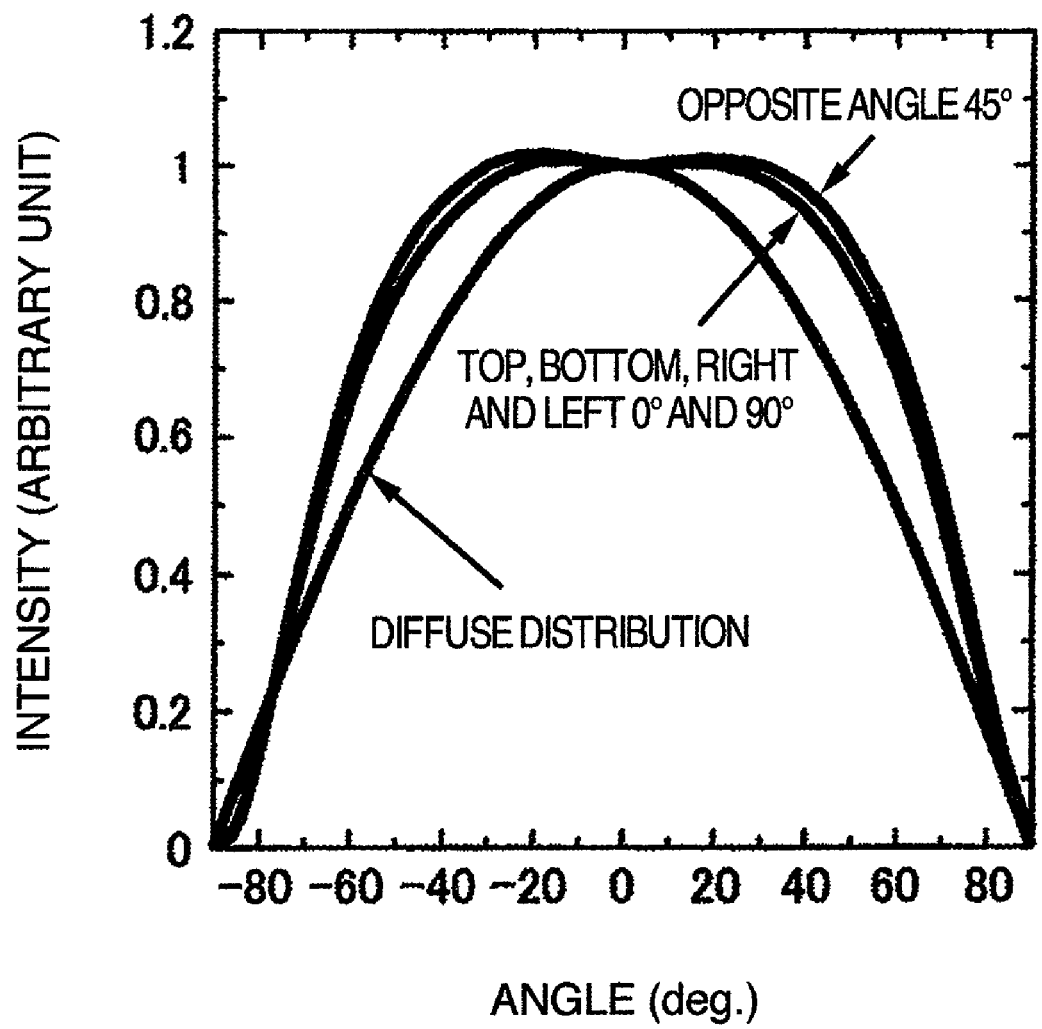
FIG. 3 is a graph showing light emission angle distribution in the conventional light emitting diode device.

The prior-art LED device has the light emission distribution as shown in FIG. 3. FIG. 3 has the ordinate axis represented by the light emission intensity and the abscissa axis represented by the inclination angle (°) from the direction perpendicular to the light emission plane of the LED device. The curve represented by "top, bottom, right and left 0° and 90°" is to be plotted in the directions of 0° and 90° in the plane to the light emission area and the curve represented by "opposite angle 45°" is to be plotted in the direction of 45° in the plane to the light emission area.

In FIG. 2, the directions of "top, bottom, right and left 0° and 90°" are expressed by arrow A and the direction of "opposite angle 45°" is expressed by arrow B.

In FIG. 3, there is no great difference between the intensity distributions in the direction of opposite angle 45° and in the direction of top and bottom 0° and right and left 90° and both the light emission distributions have a similar shape. In a bare device, the refractive index of the surface layer is reflected, so that the intensity distribution has the tendency that the light emission distribution is maximized near the total reflection angle. The complete diffuse distribution is shown in FIG. 3, although as compared with this distribution, the anisotropic light emission distribution is shown.

The structure of the LED device according to the embodiment is now described.

In the structure of the embodiment, the LED device is constructed so that the light emission intensity distribution is increased by total reflection and reflection at opposite corners and light is taken out effectively in the directions of opposite corners in the shape of the device. Consequently, the intensity distribution in the direction of opposite angle 45° can be increased as compared with the directions of top and bottom 0° and right and left 90° of the device. The "opposite corner" represents three-dimensional angular part in the light emission area and the substrate and represents the angle formed by intersection of ridgelines formed by intersection of at least three planes.

In order to realize the above object, the light emission areas in the directions of top, bottom, right and left are assigned to the electrode structure and narrow electrode structure is provided without providing electrodes having large area in the direction of the opposite angle. Moreover, in order to take out light by the reflection at the opposite corners effectively, it is designed to provide the light emission area including the light emitting layer and the clad layer independent of the substrate of the device and divide the light emission area in the form of rectangular parallelepiped to form a lot of opposite corners.

Figure 4:
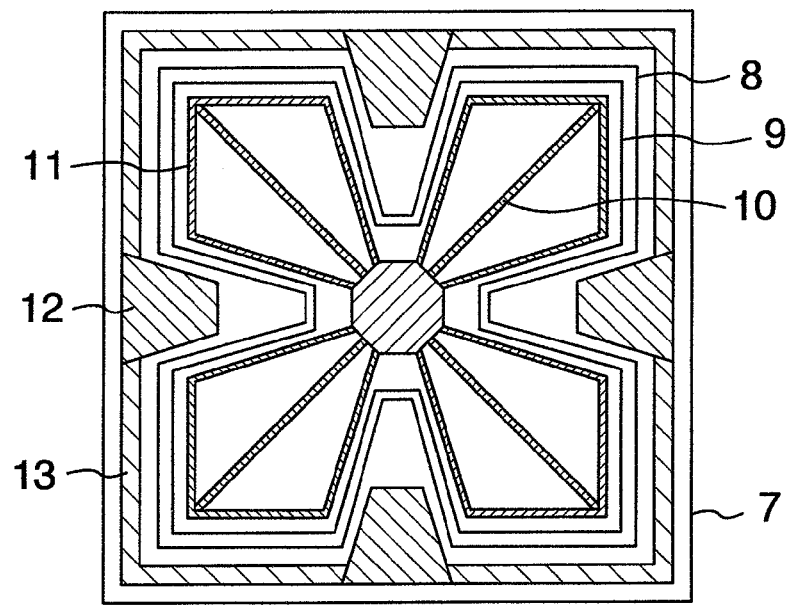
FIG. 4 is a top view illustrating electrode structure of a light emitting diode device of the present invention.
Figure 5:
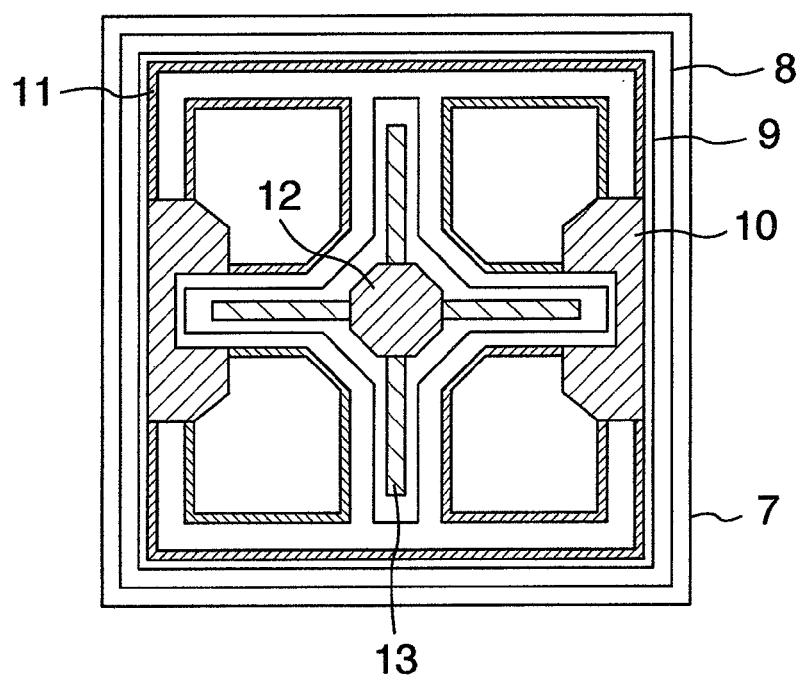
FIG. 5 is a top view illustrating electrode structure of a light emitting diode device of the present invention.

FIGS. 4 and 5 are top views illustrating the light emission area and the electrode structure in the LED device of the present invention. In FIG. 4, the light emission area containing the light emitting layer and the clad layer is first formed by growing crystal on the monocrystal substrate 7 and then the light emission area 8 shown in FIG. 4 is fabricated by etching. Thereafter, transparent electrode layer 9, cathode electrode 10 and positive narrow electrode 11 are formed and then anode electrode 12 and negative narrow electrode 13 are formed. In this structure, the cathode electrode is disposed in the middle of the device and the light emission area having large area is provided in the directions of the opposite corners. In this structure of the device, the narrow electrode is utilized to apply current in the direction of the opposite angle and light emission component in the light emission area is propagated in the direction of the opposite angle. Consequently, the light emission intensity distribution is relatively increased in the directions of the opposite corners. In FIG. 5, the light emission area containing the light emitting layer and the clad layer is first formed by growing crystal on the monocrystal substrate 7 and then the light emission area 8 shown in FIG. 5 is fabricated by etching. Thereafter, transparent electrode layer 9, cathode electrode 10 and positive narrow electrode 11 are formed and then anode electrode 12 and negative narrow electrode 13 are formed. In this structure, the anode electrode is disposed in the middle of the device and the light emission area in the form of rectangular parallelepiped is disposed symmetrically to the middle on the opposite angle side of the device. Light emission component is taken out effectively in the directions of the opposite corners. The cathode electrode having large area is opened in the direction that the light emission distribution is blocked and accordingly the cathode electrode is avoided from being disposed in the directions of the opposite corners. The above structure shows representative examples of the present invention and the main points thereof reside in the structure that the light emission area is disposed symmetrically to the middle of the device and light is taken out effectively from the opposite corners. In the device, the light emission area is provided independent of the substrate and is mainly formed into rectangular parallelepiped. The number of opposite corners is at least 6 or more.

Figure 6:
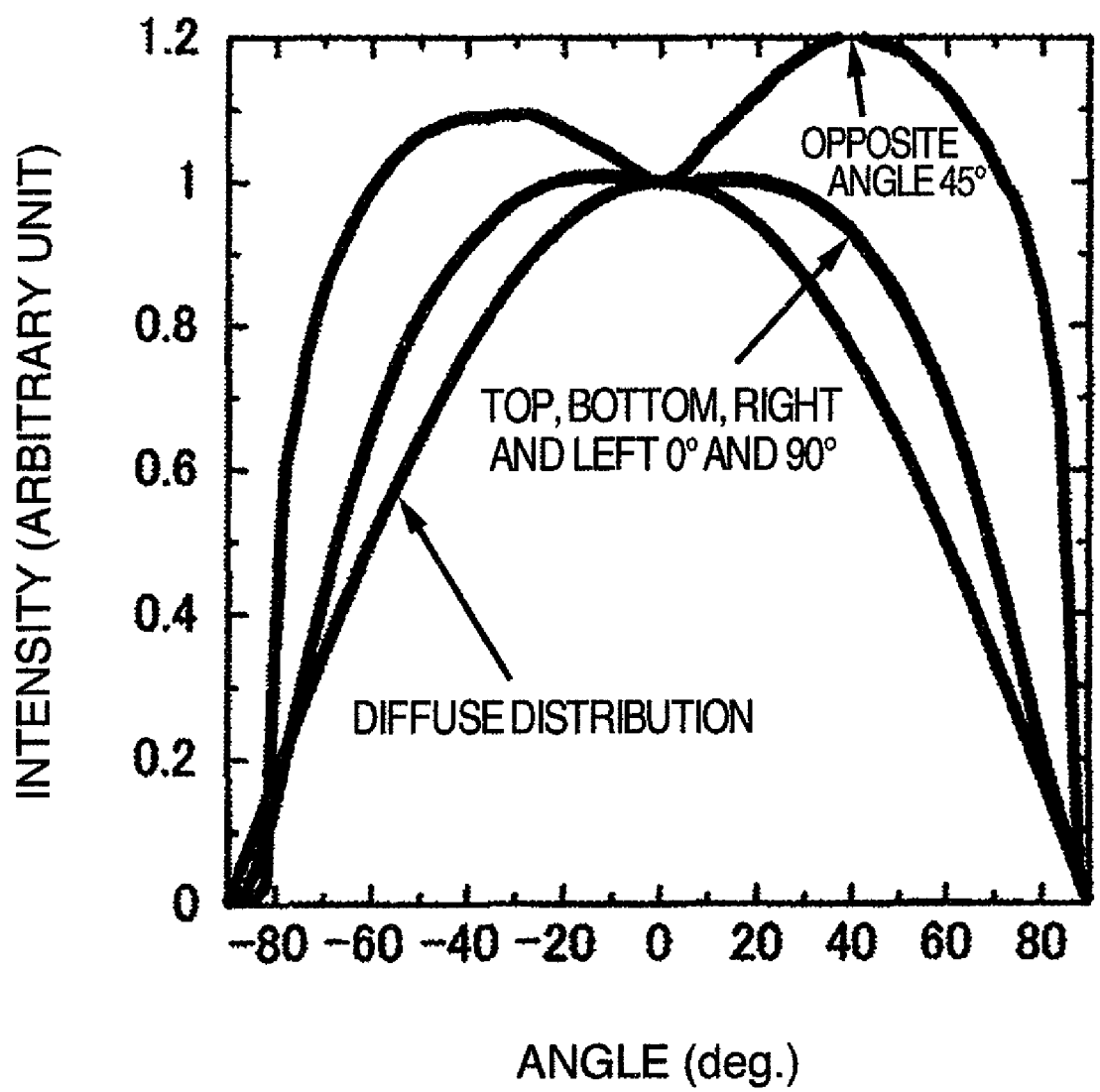
FIG. 6 is a graph showing light emission angle distribution of the light emitting diode device of the present invention.

A representative example of the light emission distribution of the LED device of the present invention is shown in FIG. 6.

FIG. 6 has the ordinate axis represented by the light emission intensity and the abscissa axis represented by the inclination angle from the perpendicular direction similarly to FIG. 3 and shows the light emission distribution for top, bottom, right and left 0° and 90°, opposite angle 45° and complete diffuse distribution.

The light emission distribution in the directions of top and bottom 0° and right and left 90° of the device has the tendency similar to the conventional device usually and has no great difference therebetween, although peculiar light emission distribution is exhibited in the direction of opposite angle 45°. The light emission intensity distribution has a peak in the range of angle 30° to 50° and is increased by 1.2 to 1.3 times as compared with that in the directions of top and bottom 0° and right and left 90°. This proves that light is taken out effectively in the directions of the opposite corners.

Figure 7:
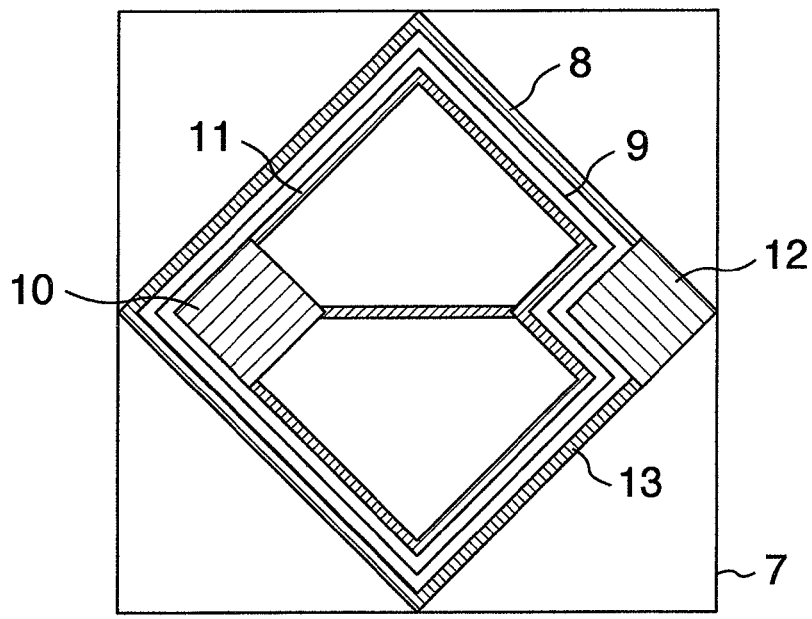
FIG. 7 is a top view illustrating electrode structure of a light emitting diode device of the present invention.

Another structure of the LED device of the present invention is now described. In FIG. 7, the directions of the opposite corners of the light emission area 8 are shifted from those of the monocrystal substrate 7 of the device and the opposite corners of the substrate and the light emission area are formed independently. By this structure, the number of opposite corners from which light is taken out effectively can be increased. In FIG. 7, the light emission area containing the light emitting layer and the clad layer is first formed by growing crystal on the monocrystal substrate 7 and then the light emission area 8 shown in FIG. 7 is fabricated by etching. Thereafter, transparent electrode layer 9, cathode electrode 10 and positive narrow electrode 11 are formed and then anode electrode 12 and negative narrow electrode 13 are formed. In this structure, there are at least 8 opposite corners including four opposite angles of the substrate and 4 opposite corners of the light emission area.

In FIG. 7, the directions of the opposite corners of the light emission area are shifted by 45° (30° to 60°) from the directions of the opposite corners of the substrate.

Figure 8:
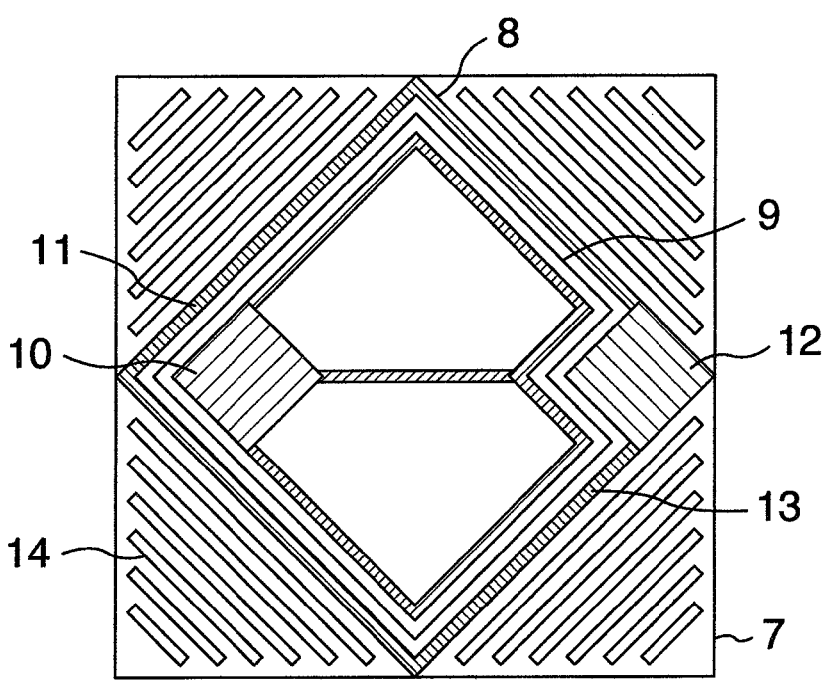
FIG. 8 is a top view illustrating electrode structure of a light emitting diode device of the present invention.

The device shown in FIG. 8 is fabricated similarly to that of FIG. 7, although the opposite corners of the light emission area 8 are shifted from the opposite corners of the monocrystal substrate 7 and the area in which the light emission area does not exist is formed in the opposite corners of the monocrystal substrate 7. Accordingly, uneven shape 14 of the substrate is fabricated in the opposite corners of the monocrystal substrate 7 upon etching. The uneven shape 14 of the substrate is adapted to the light emission distribution of the device in the opposite corners and is designed to be the light taking-out plane in the form of triangle in section properly, so that light can be taken out effectively from the opposite corners of the substrate and the light taking-out efficiency can be improved.

Figure 9:
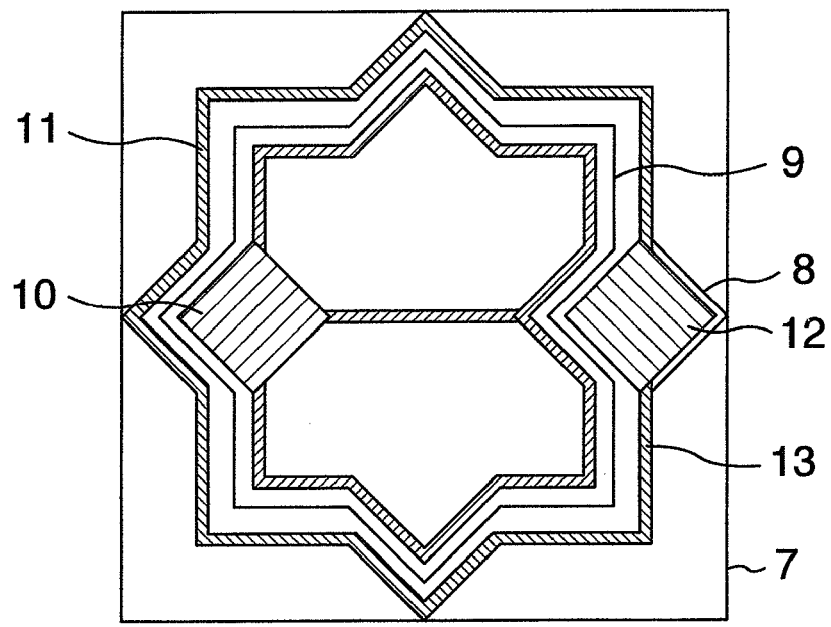
FIG. 9 is a top view illustrating electrode structure of a light emitting diode device of the present invention.
Figure 10:
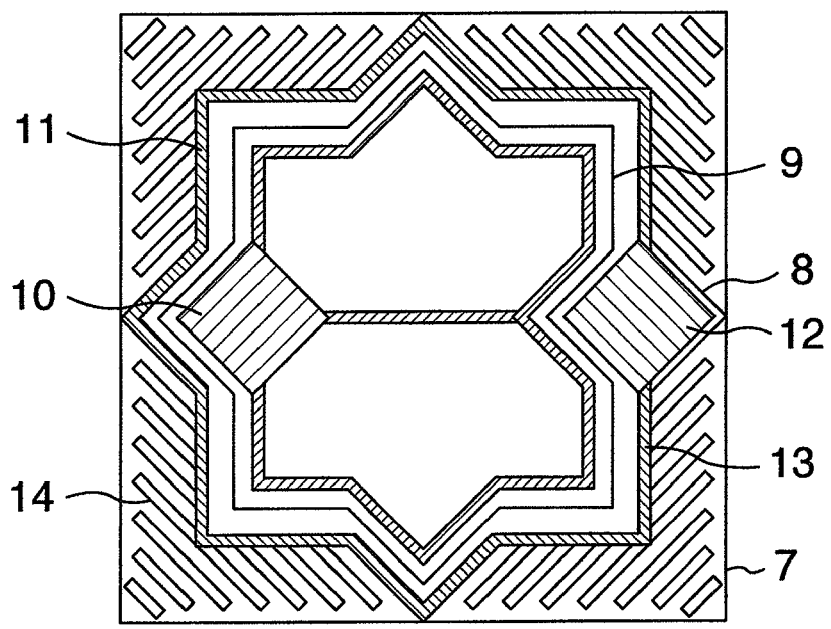
FIG. 10 is a top view illustrating electrode structure of a light emitting diode device of the present invention.

In the device shown in FIG. 9, the light emission area is formed to be more polygonal as compared with the structure of FIG. 7 to increase the number of opposite corners from which light is taken out effectively. In FIG. 9, the light emission area containing the light emitting layer and the clad layer is first formed by growing crystal on the monocrystal substrate 7 and then the light emission area 8 shown in FIG. 9 is fabricated by etching. Thereafter, transparent electrode layer 9, cathode electrode 10 and positive narrow electrode 11 are formed and then anode electrode 12 and negative narrow electrode 13 are formed. The device shown in FIG. 10 is fabricated similarly to that of FIG. 9, although the light emission area is formed to be polygonal and the area in which the light emission area does not exist is formed in the opposite corners of the substrate. Accordingly, uneven shape of the substrate is fabricated in this area upon etching. The uneven shape of the substrate is adapted to the light emission distribution of the device in the opposite corners and is designed to be the light taking-out plane in the form of triangle in section properly, so that light can be taken out effectively from the opposite corners of the substrate and the light taking-out efficiency can be improved.

According to the embodiment of the present invention, the light emission distribution in the directions of the opposite corners of the light emitting device, particularly, LED device is controlled so that an amount of light taken out can be increased. The directional properties of the LED device can be utilized to match mounting and direction of disposition in the package to use of the light sources for illumination and backlight and the method of use fitted to the design can be found newly. The structure of the light emitting diode device of the embodiment can be applied to light sources for illumination, liquid crystal panel display apparatuses for televisions, liquid crystal panels for personal computers and backlight sources for car navigation.

Embodiment 2

Figure 11:
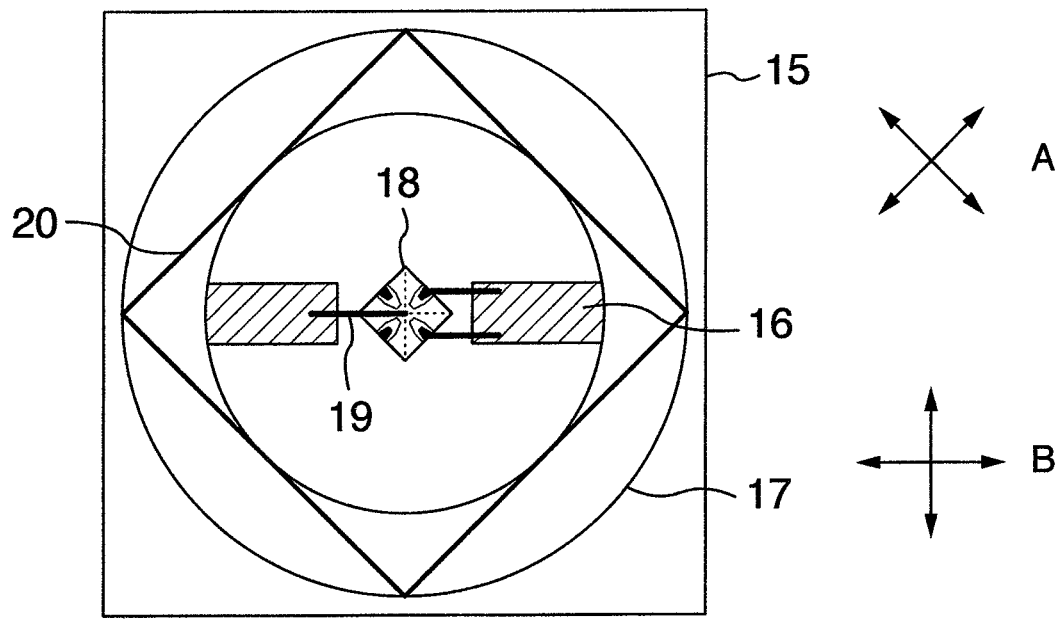
FIG. 11 is a top view illustrating package structure in which a light emitting diode device of the present invention is mounted.

Referring now to FIGS. 11 to 23, the package structure in which the LED device of the present invention is mounted is described. In the embodiment, the LED device as described in the embodiment 1 is mounted to form the package structure fitted to the light emission distribution to be designed. In FIG. 11, wiring 16 is formed on metal or ceramic substrate 15 having insulating layer and reflecting plate 17 is formed integrally. Then, light emitting diode device 18 is bonded on base by means of die bonding and thereafter wire bonding is made using Au wire 19. Further, transparent resin 20 is used to seal the light emitting diode device 18, so that the package structure of surface mounting type is fabricated.

Figure 12:
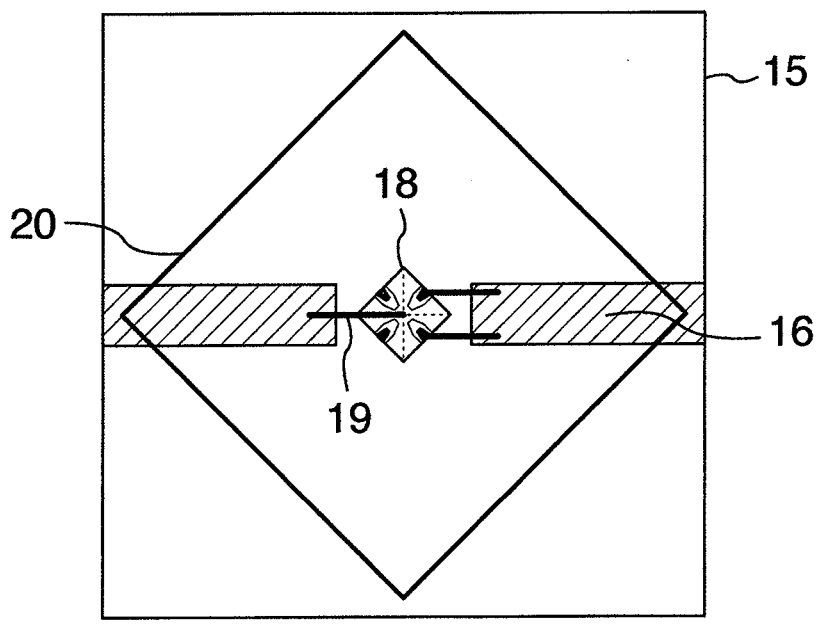
FIG. 12 is a top view illustrating package structure in which a light emitting diode device of the present invention is mounted.

In this case, the directions of the opposite corners of the light emitting diode device 18 are shifted by about 45° from the directions of the opposite corners of the metal or ceramic substrate 15 having the insulating layer to be bonded by means of die bonding. Moreover, the sealing shape of the transparent resin 20 is conformed to the directions of the opposite corners of the light emitting diode device 18 and the opposite corners of the transparent resin 20 are conformed to those of the light emitting diode device 18 in top, bottom, right and left. In FIG. 12, the package structure is fabricated similarly to that of FIG. 11, although the transparent resin 20 is directly fabricated by metal mold without using the reflecting plate 17 so that it is formed into a rectangular parallelepipedic rhombus to be conformed to the LED device.

In the embodiment, difference in the light emission distribution depending on the direction of the shape of the transparent resin is now described.

Figure 13:
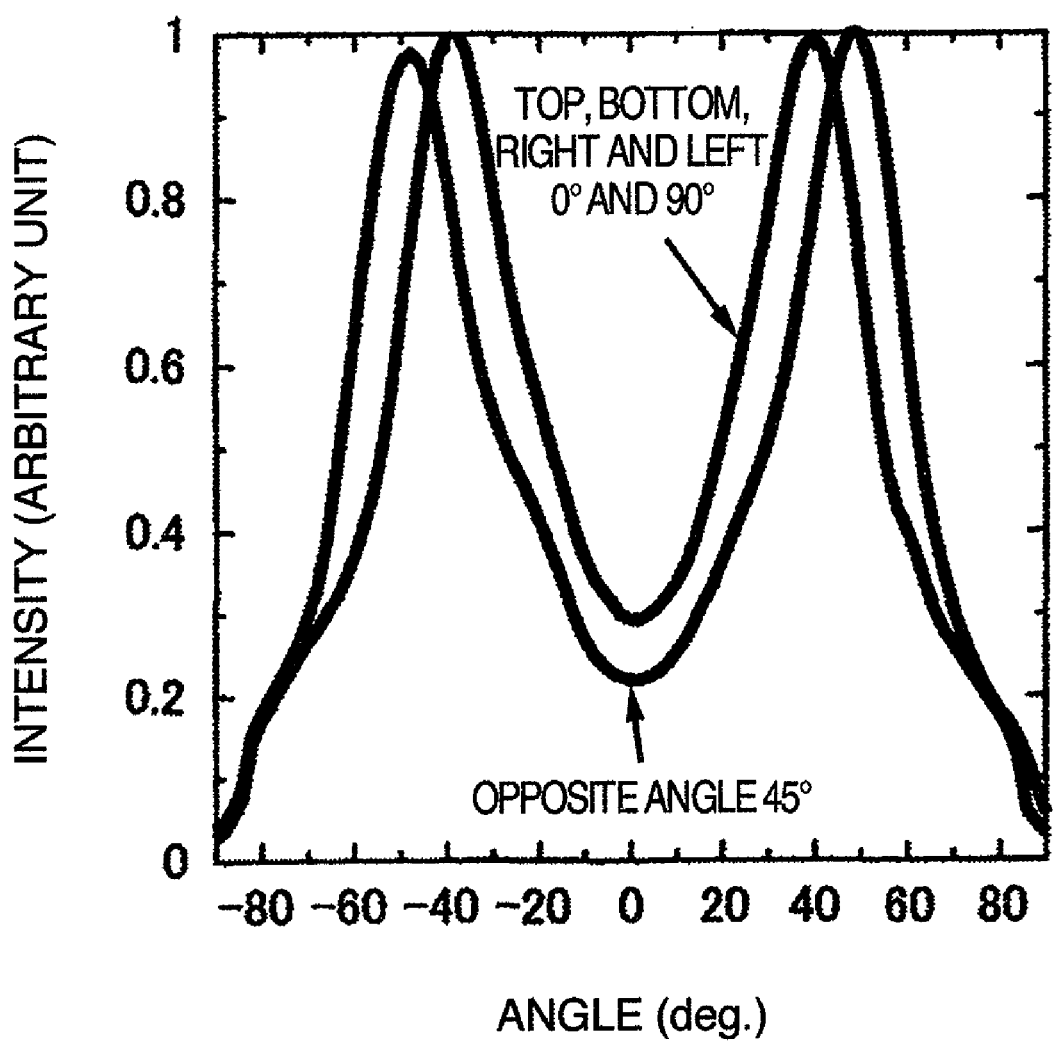
FIG. 13 is a graph showing light emission angle distribution in the package structure in which the light emitting diode device of the present invention is mounted.

FIG. 13 shows the light emission distribution in the embodiment. FIG. 13 has the ordinate axis represented by the light emission intensity and the abscissa axis represented by the inclination angle from the direction perpendicular to the light emission plane similarly to FIGS. 3 and 6. FIGS. 3 and 6 show the light emission distribution of the LED device itself but FIG. 13 shows the light emission distribution of the package structure (module structure) in which the LED device is mounted.

Since the directions of top, bottom, right and left 0° and 90° indicate the directions of 0° and 90° in the plane to the light emission area of the LED device, the directions are expressed by arrow A of FIG. 11. Further, the direction of opposite angle 45° is expressed by arrow B of FIG. 11.

In FIG. 13, the light emission intensities of top, bottom, right and left 0° and 90° and opposite angle 45° are standardized, although actually the light emission intensity of opposite angle 45° is larger than that of top, bottom, right and left 0° and 90°.

As shown in FIG. 13, the angle in which the radiation angle is peak can be increased in the direction of opposite angle 45° of the transparent resin as compared with the direction of top and bottom 0° and right and left 90° of the transparent resin and the peak can be shifted to the high angle side in the range of 10° to 15° of the radiation angle. The opposite corners are utilized even in the transparent resin for sealing the LED device to thereby control the light emission distribution of the package structure.

Figure 14:
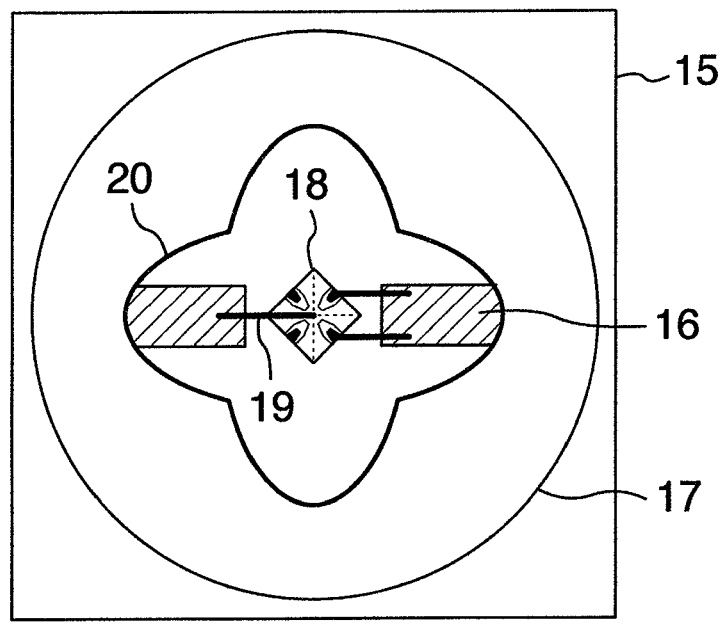
FIG. 14 is a top view illustrating package structure in which a light emitting diode device of the present invention is mounted.
Figure 15:
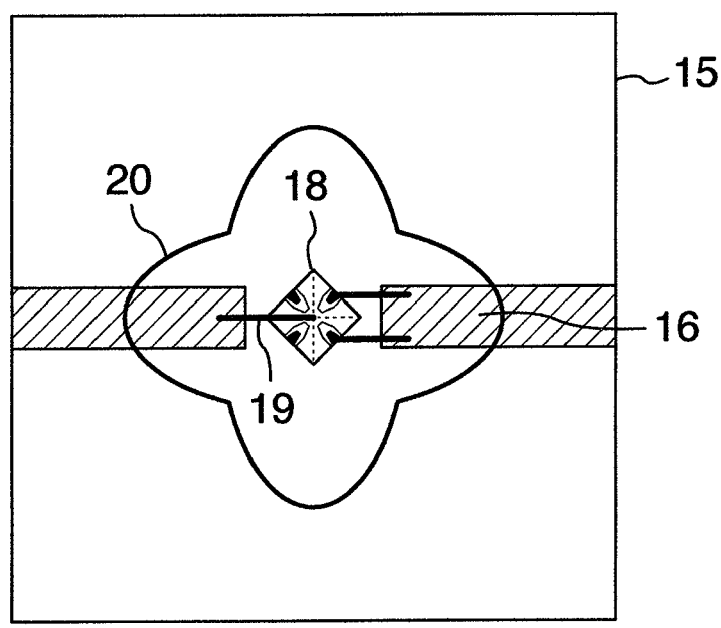
FIG. 15 is a top view illustrating package structure in which a light emitting diode device of the present invention is mounted.

In another shape of the package structure, the strong anisotropy that the light emission distribution in the directions of top, bottom, right and left is emphasized to increase the intensity can be featured. In FIG. 14, wiring 16 is formed on metal or ceramic substrate 15 having insulating layer and reflecting plate 17 is formed integrally. Then, light emitting diode device 18 is bonded on base by means of die bonding and thereafter wire bonding is made using Au wire 19. Further, transparent resin 20 is used to seal the light emitting diode device 18, so that the package structure of surface mounting type is fabricated as shown in FIG. 14. In this case, the directions of the opposite corners of the light emitting diode device 18 are shifted by about 45° from the directions of the opposite corners of the metal or ceramic substrate 15 having the insulating layer. Moreover, the sealing shape of the transparent resin 20 increases the light emission distribution in the directions of opposite corners from the shape of the light emitting diode device 18 and the resin shape is formed to concentrate light in the directions of top, bottom, right and left so that the anisotropy is exhibited. In FIG. 15, the package structure is fabricated similarly to that of FIG. 14, although the transparent resin 20 is directly fabricated by metal mold without using the reflecting plate 17 so that it is formed into a rectangular parallelepipedic rhombus to be conformed to the LED devices. The light emission distribution can be controlled similarly. In this resin shape, the light emission distribution having stronger anisotropy that the light emission intensity is emphasized in the directions of top, bottom, right and left can be controlled as compared with the case of the rectangular parallelepipedic rhombus shown in FIGS. 11 and 12.

Figure 16:
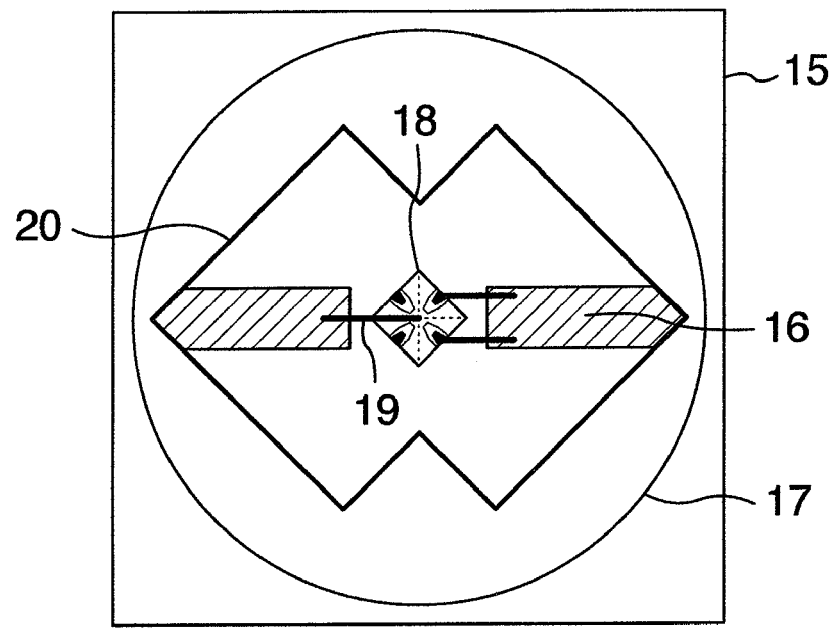
FIG. 16 is a top view illustrating package structure in which a light emitting diode device of the present invention is mounted.
Figure 17:
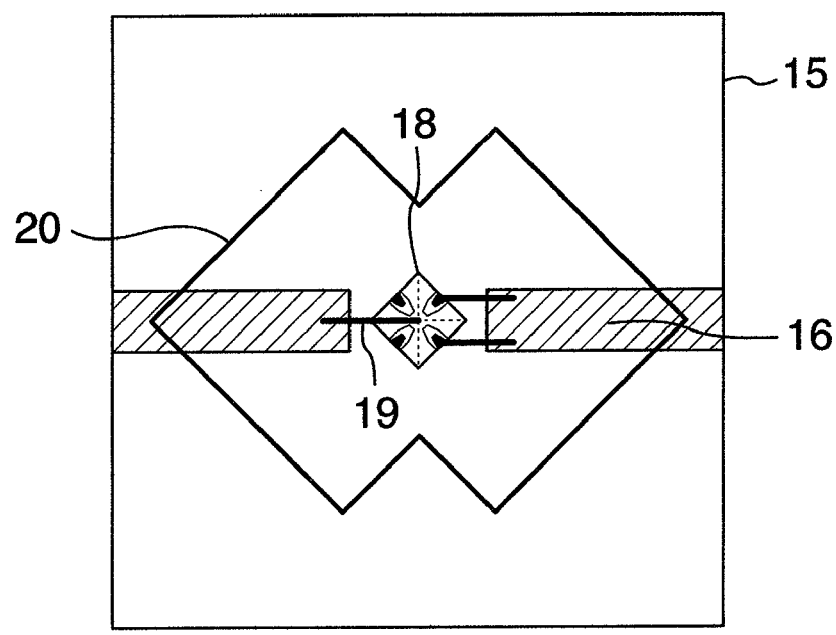
FIG. 17 is a top view illustrating package structure in which a light emitting diode device of the present invention is mounted.
Figure 18:
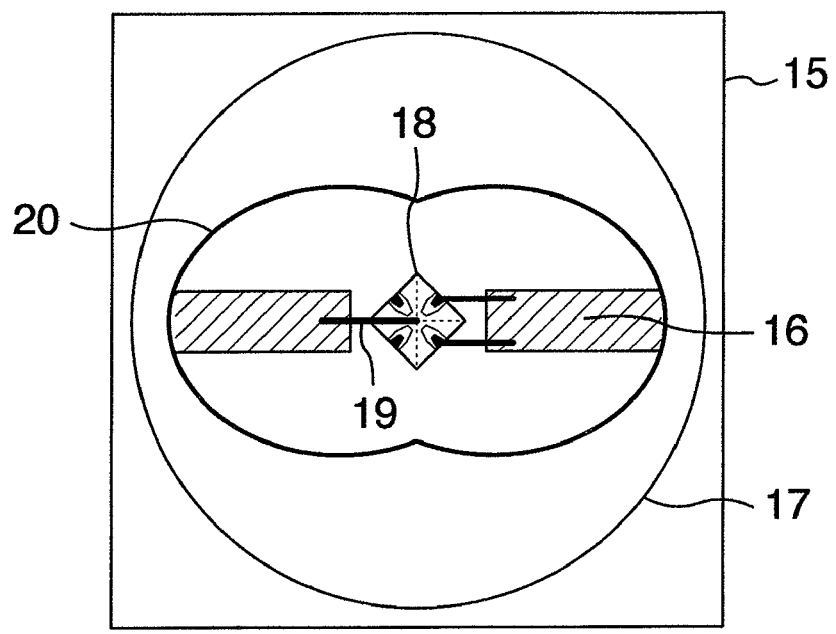
FIG. 18 is a top view illustrating package structure in which a light emitting diode device of the present invention is mounted.

In another shape of the package structure, the light emission distribution having the stronger anisotropy in the direction of right and left can be attained. As shown in FIGS. 16 to 19, the device is disposed in the middle of the package and the inner peripheral shape of the reflecting plate and the shape of the transparent resin are expanded right and left. In FIGS. 16 and 18, wiring 16 is formed on metal or ceramic substrate having insulating layer and reflecting plate 17 is formed integrally. Then, light emitting diode device 18 is bonded on base by means of die bonding and thereafter wire bonding is made using Au wire 19. Further, transparent resin 20 is used to seal light emitting diode device 18, so that the package structure of surface mounting type shown in FIGS. 16 and 18 is fabricated.

Figure 19:
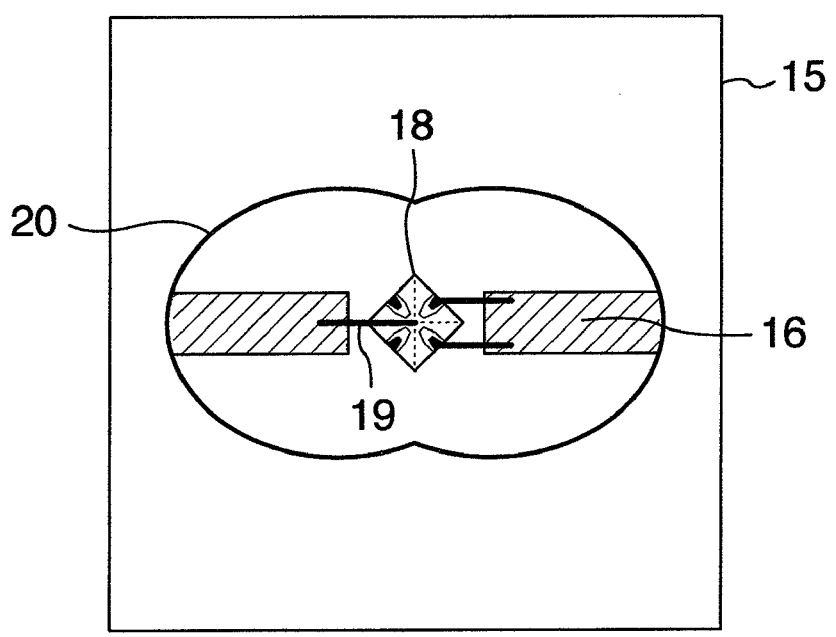
FIG. 19 is a top view illustrating package structure in which a light emitting diode device of the present invention is mounted.

In this case, the directions of the opposite corners of the light emitting diode device 18 are shifted by about 45° from the directions of the opposite corners of the metal or ceramic substrate 15 having the insulating layer to be bonded by means of die bonding. Moreover, the sealing shape of the transparent resin 20 increases the light emission distribution in the directions of opposite corners of right and left from the shape of the light emitting diode device 18. The sealing shape of the transparent resin 20 is formed to have cone shape or peanut shape on both the right and left sides. Consequently, the light emission distribution of the package structure can be realized to have the peak intensity on the high angle side in the directions of opposite corners of both sides around the LED device. In FIGS. 17 and 19, the package structure is fabricated similarly to that of FIGS. 16 and 18, although the transparent resin 20 is directly fabricated by metal mold without using the reflecting plate 17 so that it is formed into a rectangular parallelepipedic rhombus to be conformed to the LED device. The light emission distribution can be controlled similarly. In this resin shape, the light emission distribution having stronger anisotropy that the light emission intensity is emphasized in the directions of right and left can be controlled.

Figure 20:
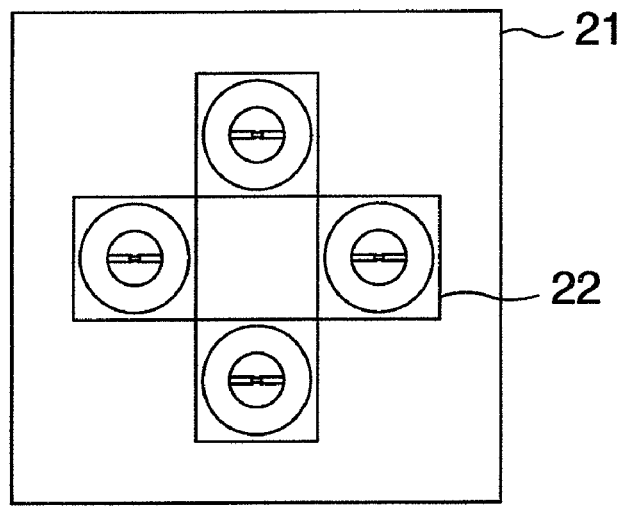
FIG. 20 is a top view illustrating package structure in which light emitting diode devices of the present invention are mounted independently.
Figure 21:
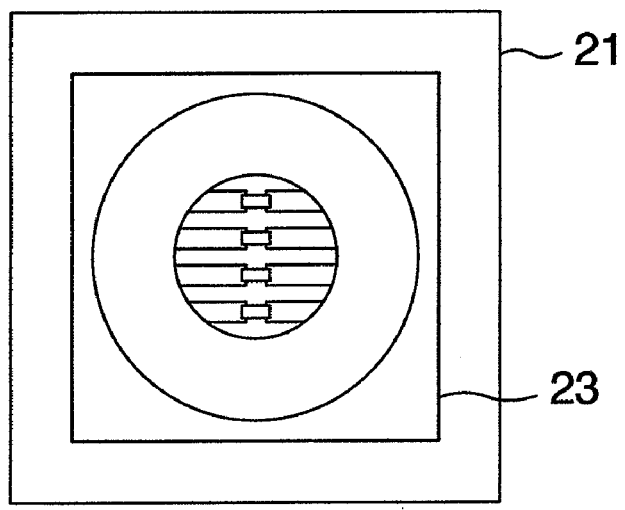
FIG. 21 is a top view illustrating package structure in which light emitting diode devices of the present invention are mounted in the same manner.
Figure 22:
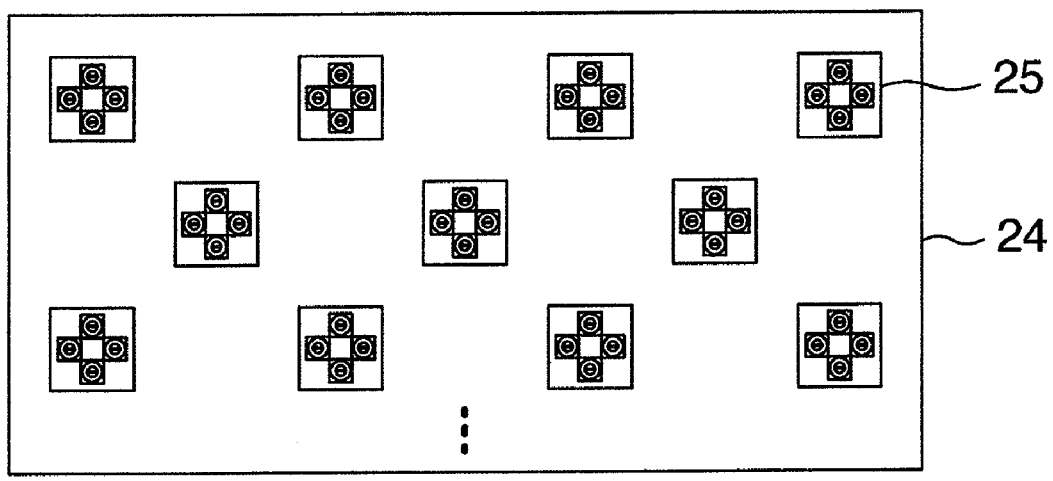
FIG. 22 is a top view illustrating a housing of backlight in which the light emitting diode devices of the present invention are mounted independently.
Figure 23:
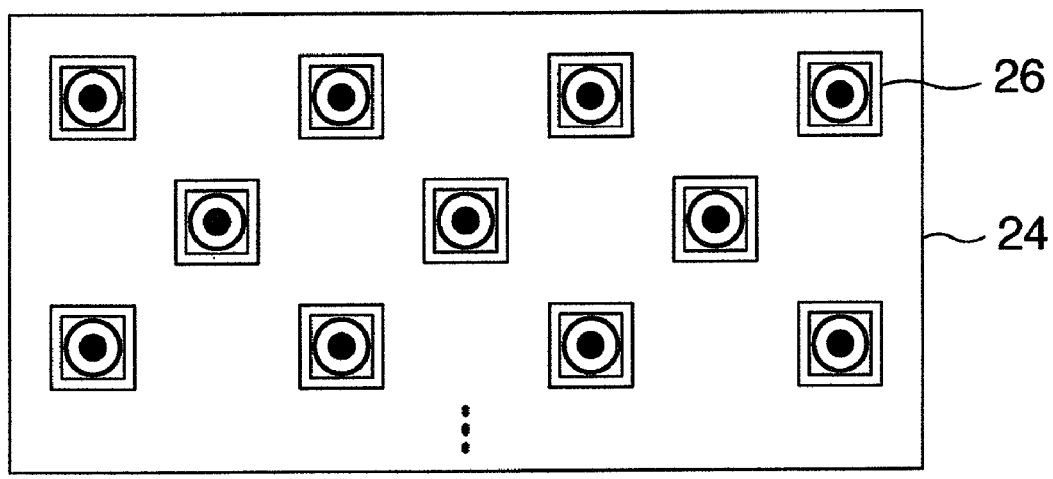
FIG. 23 is a top view illustrating a housing of backlight in which the light emitting diode devices of the present invention are mounted in the same manner.

There are two methods of mounting the LED devices for three primary colors of RGB in the package. In FIG. 20, the LED devices for RGGB are mounted in respective packages independently. In FIG. 21, the LED devices for RGGB are mounted in the same package. The packages are mounted in a housing as shown in FIGS. 22 and 23 and are stuck to make connection. The packages of FIGS. 20 and 21 are mounted in the housing in the arrangement of triangular lattice or zigzag. As described above, the package structure has the light emission distribution having the strong anisotrophy that the amount of light taken out is increased in the directions of top, bottom, right and left by controlling the arrangement of mounting the LED devices and the sealing shape of the transparent resin and the light emission distribution of the package structure is fitted to the arrangement of triangular lattice or zigzag of the packages mounted in the housing. Any structure of FIGS. 22 and 23 can attain sufficient brightness as illumination apparatuses and backlight sources and realize uniform brightness distribution in a plane. The distance between packages and the optical distance between a panel optical system and the packages can be set properly to realize uniform chromaticity distribution in a plane.

According to the embodiment of the present invention, the light emission distribution in the directions of opposite corners can be controlled by not only the LED devices but also the sealing shape of the transparent resin and the amount of light taken out can be increased. The directional properties in the light emission distribution of the package structure can be utilized to be fitted to the illumination light sources and the backlight sources and the utilization method suitable for the design can be found newly. Since the package structure using no reflecting plate can be also utilized, it is useful as the technique suitable for low cost. The package structure of the embodiment can be also applied to illumination light sources and backlight sources for liquid crystal panel display apparatuses for televisions, liquid crystal panels for personal computers and car navigation.

Embodiment 3

Figure 24:
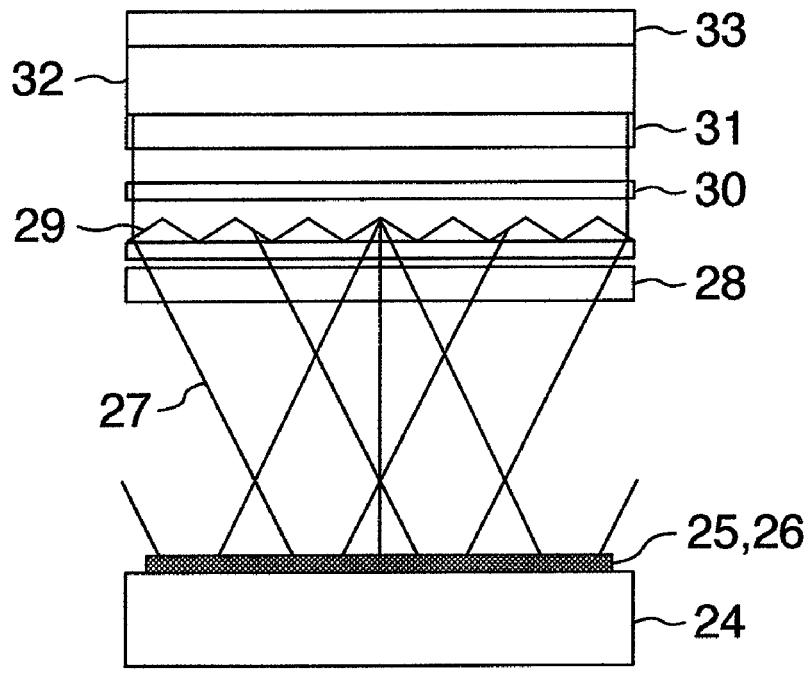
FIG. 24 is a sectional view illustrating structure of a backlight module of light emitting diode devices, optical film and a liquid crystal panel of the present invention.
Figure 25:
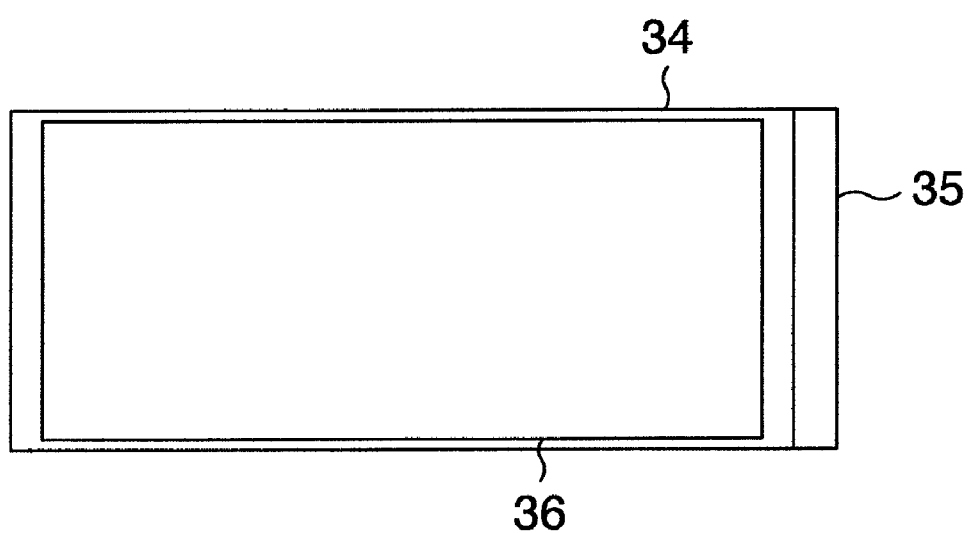
FIG. 25 is a sectional view illustrating a large-sized liquid crystal panel display apparatus using a backlight module of light emitting diode devices of the present invention.
Figure 26:
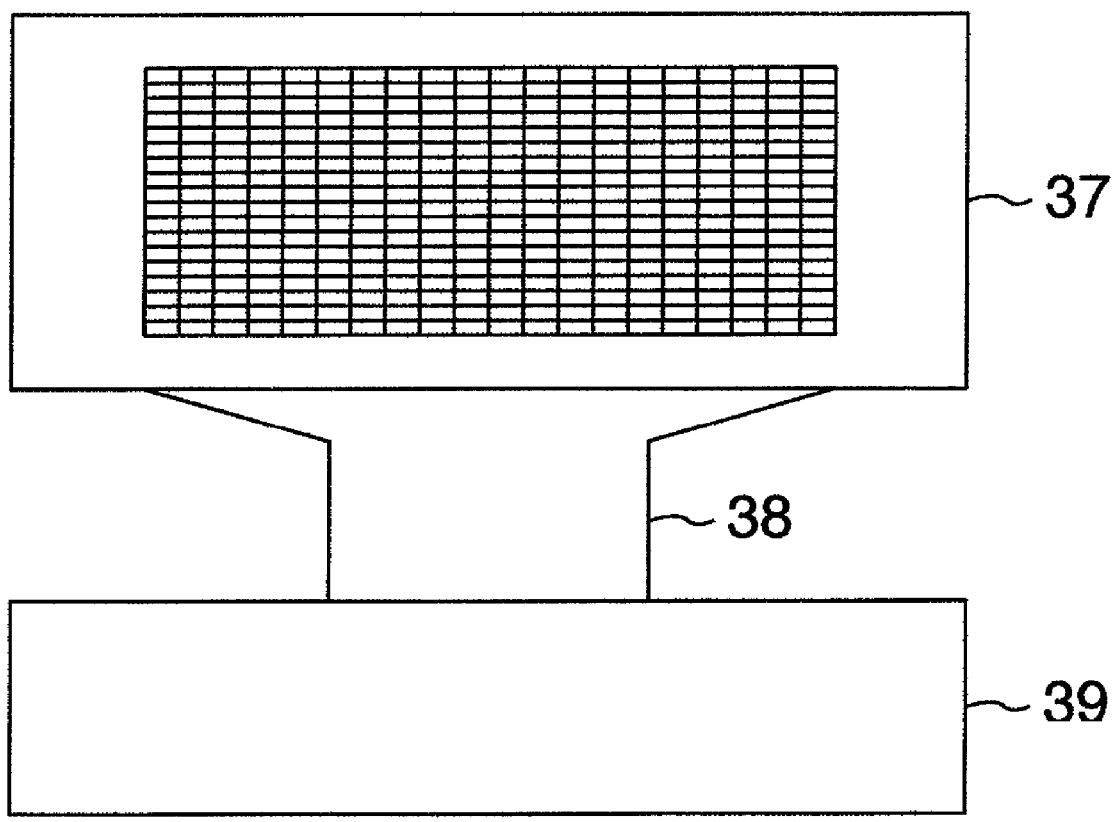
FIG. 26 is a sectional view illustrating a small and medium-sized liquid crystal panel display apparatus using a backlight module of light emitting diode devices of the present invention.

Referring now to FIGS. 24 to 26, another embodiment of the present invention is described.

FIG. 24 is a sectional view illustrating a liquid crystal display apparatus for television in which light emitting diode devices according to the embodiment of the present invention are mounted. A module in which packages having LED devices mounted therein are mounted is disposed on a backlight module housing 24. Backlight rays 27 emitted from the packages pass through a diffuse plate 28, a prism sheet 29, a diffuse film 30, a lower polarizing plate 31, a thin-film transistor circuit and liquid crystal panel for television 32 and an upper polarizing plate 33 and illuminate the liquid crystal panel display apparatus.

The backlight module constituting the liquid crystal panel display apparatus of the embodiment includes the inventive contents about the structure of LED devices and the shape of transparent resin described in the above embodiments. FIG. 25 shows in top view the structure of a large-sized liquid crystal television and it includes a backlight housing 34, a driving circuit 35 and a large-sized liquid crystal display panel 36. FIG. 26 shows the structure of a small and medium-sized liquid crystal display panel 37 including a backlight module and an optical system, circuit wiring 38 and a driving circuit 39.

According to the embodiment of the present invention, even in not only a large-sized but also small and medium-sized liquid crystal display apparatus, the backlight module having the controlled light emission distribution of the package structure is made to function, so that the uniformity of the brightness distribution and the chromaticity distribution required can be ensured. The package structure of the embodiment can be also applied to illumination light sources and backlight sources for liquid crystal panel display apparatuses for televisions, liquid crystal panels for personal computers and car navigation.

The present invention can be applied to high-efficiency and high-brightness white light sources and backlight modules and backlight sources for the liquid crystal display apparatuses for large-sized liquid crystal televisions and small and medium-sized liquid crystal display apparatus for mobile telephones and personal computers.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An illumination apparatus including a plurality of light emitting diode devices mounted therein, wherein
the light emitting diode device includes a rectangular substrate having four edges, a light emission area having a light emitting layer and a clad layer formed by growing crystal on the substrate, an anode electrode and a cathode electrode, and
the light emission area has at least three pairs of opposing corners in which each pair include a first corner of the light emission area and a second corner of the light emission area arranged substantially opposite to the first corner,
two pairs of the at least three pairs of the light emission area being disposed symmetrically with respect to a line extending between a middle point of a first of two opposite edges of the substrate and through a center of the substrate, and one pair of the at least three pairs being disposed along a line extending between a middle point of a second of two opposite edges of the substrate and through the center of the substrate, and
the light emission area does not exist at opposing corners of the substrate.

2. An illumination apparatus according to claim 1, wherein
the plurality of light emitting diode devices are mounted on a wired substrate having wiring, and
the substrate is mounted so that the opposing corners of the substrate in the light emitting diode device are positioned in direction of the wiring.

3. An illumination apparatus according to claim 1, wherein
the plurality of light emitting diode devices are mounted on a wired substrate and
the plurality of light emitting diode devices are mounted in arrangement of triangular lattice or zigzag in the wired substrate.

4. A liquid crystal display apparatus using the illumination apparatus according to claim 1 as a backlight source.

5. An illumination apparatus according to claim 1, wherein
the light emitting diode device is mounted on wiring with an optical reflector and
a shape of an inner periphery of the reflecting plate is formed into cone or peanut symmetrical to direction of both right and left sides, the light emitting layer being disposed in middle of an inner peripheral area of the reflecting plate, the light emitting layer being sealed by transparent resin.

6. An illumination apparatus according to claim 1, wherein the substrate has four corners, and directions of the opposing corners of the light emission area and those of the substrate are shifted or deviated from each other by 30 to 60 degrees.

7. An illumination apparatus according to claim 1, comprising an uneven part having a shape of a triangle in section is formed in an area other than the light emission area in the substrate at each of the opposing corners of the substrate.

8. A liquid crystal display apparatus using the illumination apparatus according to claim 3 as a backlight source.

9. An illumination apparatus according to claim 1, wherein the plurality of light emitting diode devices are mounted on a wired substrate, and opposing corners provided in the substrate and the light emission area of the light emitting diode device are separated, the light emission area including at least four pairs of opposing corners.

10. An illumination apparatus according to claim 1, wherein the plurality of light emitting diode devices are mounted on a wired substrate, and waveguides are disposed from center of the light emitting diode device toward the opposite corners, so that emitted light components propagating in the waveguides are emitted from the opposing corners.

11. An illumination apparatus according to claim 1, further comprising:

a positive narrow electrode having a first line width, the anode electrode having a line width which is larger than the first line width of the positive narrow electrode, and a negative narrow electrode having a second line width, the cathode electrode having a line width which is larger than the second line width of the negative narrow electrode.

12. An illumination apparatus according to claim 1, wherein the two pairs of the at least three pairs of the light emission area have one of the first corner and the second corner in common so that lines extending between the two pairs are disposed symmetrically at opposite sides of the line extending between the middle point of the first of the two opposite edges of the substrate and through the center of the substrate.

13. An illumination apparatus according to claim 1, wherein at least one other pair of opposing corners of the light emission area is disposed along a diagonal line extending between two opposing corners of the substrate and through the center of the substrate.

14. An illumination apparatus including a plurality of light emitting diode devices mounted therein, wherein the light emitting diode device includes a substrate, a light emission area having a light emitting layer and a clad layer formed by growing crystal on the substrate, anode electrode and a cathode electrode, and the light emission area has 6 or more opposite corners, the opposite corners being disposed symmetrically to middle of the light emitting diode device; wherein the light emitting diode device is mounted on wiring without provision of a reflecting plate, and transparent resin sealing the light emitting layer is formed into cone or peanut symmetrical to direction of both right and left sides, the light emission layer being disposed in middle of an inner peripheral area of the transparent resin.

15. An illumination apparatus including a plurality of light emitting diode devices mounted therein, wherein the light emitting diode device includes a substrate, a light emission area having a light emitting layer and a clad layer formed by growing crystal on the substrate, an anode electrode and a cathode electrode, the light emission area includes at least six corners, the at least six corners of the light emission include opposing corners disposed symmetrically with respect to a middle of edges of the substrate and opposing corners disposed unsymmetrically thereto, the light emission area does not exist at opposing corners of the substrate;

a positive narrow electrode having a first line width, the anode electrode having a line width which is lamer than the first line width of the positive narrow electrode, and a negative narrow electrode having a second line width, the cathode electrode having a line width which is larger than the second line width of the negative narrow electrode.

16. An illumination apparatus according to claim 15, wherein the substrate is a rectangular substrate.

* * * * *